United States Patent [19]
Voegeli

[11] 3,940,750
[45] Feb. 24, 1976

[54] WALL TOPOLOGY STORAGE SYSTEM
[75] Inventor: Otto Voegeli, San Jose, Calif.
[73] Assignee: International Business Machines Corporation, Armonk, N.Y.
[22] Filed: Mar. 26, 1973
[21] Appl. No.: 344,659

[52] U.S. Cl. 340/174 TF; 340/174 BC; 340/174 EB; 340/174 VA; 340/174 YC
[51] Int. Cl.² .......................................... G11C 11/15
[58] Field of Search ............................... 340/174 TF

[56] References Cited
UNITED STATES PATENTS

| | | | |
|---|---|---|---|
| 3,114,898 | 12/1963 | Fuller | 340/174 TF |
| 3,176,276 | 3/1965 | Smith | 340/174 TF |
| 3,793,639 | 2/1974 | Enz et al. | 340/174 TF |
| 3,836,895 | 9/1974 | DeJonge | 340/174 TF |
| 3,868,659 | 2/1975 | Schwee | 340/174 TF |

OTHER PUBLICATIONS

IEEE Transactions on Magnetics – Sept., 1972, pp. 405–407.

Primary Examiner—James W. Moffitt
Attorney, Agent, or Firm—Joseph E. Kieninger

[57] ABSTRACT

A wall topology storage system wherein information in the form of data bits is stored as polarity reversals in magnetic domain walls separating adjacent magnetic domains. A plurality of bits is stored in each wall as a plurality of reversals, resulting in greater storage capacity than when using the adjacent domain itself.

13 Claims, 9 Drawing Figures

3,940,750

WALL TOPOLOGY STORAGE SYSTEM

FIELD OF THE INVENTION

Magnetic storage devices, particularly devices utilizing magnetic domains and magnetic domain wall storage.

BACKGROUND OF THE INVENTION

Magnetic domain storage devices are known in the prior art, where the direction of magnetization or polarity within a domain is utilized to indicate information stored in the domain. Domain walls, formed between domains of opposed polarity, have also been utilized in conjunction with domains for storage purposes. In these devices, the entire domain wall is made to be of a single uniform polarity, and can be used in conjunction with the domains for data storage. Such domain-domain wall devices are described for example in U.S. Pat. Nos. 3,140,471, 3,114,898, and 3,176,276.

Since as a generality there is one domain wall for each domain, using the walls or domains results in equal storage capacity. Using both merely doubles storage capacity. As domain or wall storage is nonvolatile, inexpensive, and has no moving parts in some configurations, it is a desirable storage medium. Higher density storage is still more desirable utilizing the domain concept.

Thus, an object of this invention is to significantly increase storage capacity in domain-domain wall devices by storing a plurality of data bits in a single wall.

Another object is to optionally represent data either by the presence and absence of wall polarity reversals or by the sense of such reversals as desired.

Still another object is to afford means for accessing data in a non-mechanical manner by utilizing equilibrium domain configurations that are translated under the influence of externally applied fields.

The overall object is to provide a storage medium, method and apparatus utilizing wall polarity reversal as a high density storage means.

These and other objects will best be understood in relation to the summary, drawings, and general description that follows.

SUMMARY OF THE INVENTION

The above objects are met by the method, medium, and apparatus of this invention. Briefly stated, this invention includes a data storage medium comprising at least one magnetic domain wall separating adjacent domains, and at least one polarity reversal in the wall representing data stored in the wall. Data may be represented by the presence and absence of wall polarity reversals or by the sense of such reversals, i.e. the polarity of wall lines. A plurality of bits may be stored in a single wall as a plurality of wall polarity reversals. In one embodiment, the data storage apparatus comprises a storage film and a drive film, each having a striped domain configuration and oriented orthogonally to each other. Other embodients are described.

IN THE DRAWINGS

Figure 8:
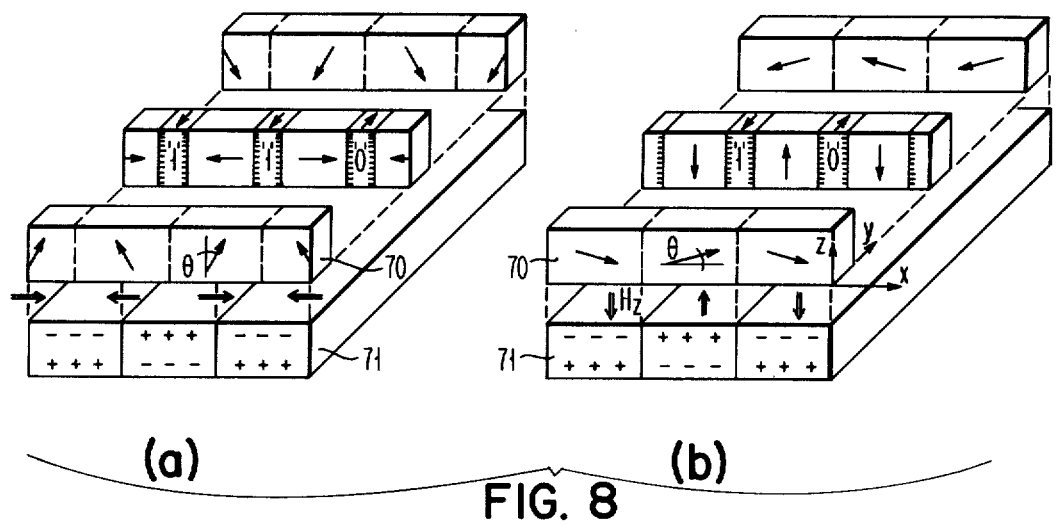

FIG. 8 schematically shows the effect of the drive film interacting with the storage film.

Figure 9:
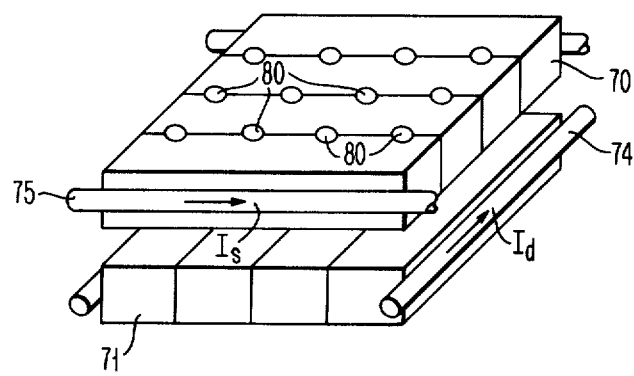

FIG. 9 shows a complete wall topology devide including domain drive means, a storage film and a drive film.

GENERAL DESCRIPTION

I. Theory of Operation

A demagnetized, anisotropic magnetic film generally consists of many domains which are uniformly magnetized along some easy direction of magnetization. The orientation of the magnetization M changes as one moves from domain to domain. Because of a strong coupling between adjacent magnetic moments, the reorientation of M does not occur abruptly at the domain boundary but over a finite transition region called a domain wall. Film thickness and material characteristics determine the domain size as well as the width of the domain walls. The chirality, i.e. the sense of rotation of M, the magnetization within the wall, is defined by the requirement of having minimal wall energy, the wall energy being roughly proportional to the angle through which M rotates across the wall. When the orientation of M in adjacent domains differs by an angle $\theta$, then one chiral state requires a rotation through an angle $\theta$, whereas the opposite state would necessitate a rotation through an angle of $(360-\theta)°$. Therefore, if M in adjacent domains is not antiparallel, then the domain magnetization determines the chiral state of the wall. Conversely, if M in the adjacent domains is antiparallel as is the case in samples with a purely uniaxial anisotropy, then the two chiral states are degenerate and hence equally likely to occur. Under those conditions, the two chiral states can be used to represent binary data. Such a storage scheme can only be practical if some energy barrier opposes a transition from one chiral state to the other. Otherwise the stored data would be volatile. A barrier, magneto static in nature, does indeed exist, because the wall energy increases momentarily during a transition between chiral states. The height of this barrier depends on the spontaneous magnetization and the thickness of the storage medium.

In wall topology storage systems with non-mechanical accessing, the storage medium should have low coercivity so that the resulting domain configuration is in equilibrium. When the medium has an uniaxial anisotropy then the magnetization in adjacent domains is antiparallel and the domains form some periodic pattern. Similarly, the magnetization configuration within each domain wall is micromagnetically defined, except that there exist two possible chiral wall states depending on the magnetization's sense of rotation within the wall. Furthermore, the transition region between wall segments of opposite chirality, subsequently referred to as wall lines, has a well defined magnetization configuration, except that there again exist two possible chiral states for the wall line depending on the magnetization's sense of rotation. In wall topology storage, binary data may be stored either in the binary chiral states of domain walls, or in the binary chiral states of wall lines. It is a chief attribute of either means of data representation that the stored data is not subject to degradation, for when perturbed, the magnetization reestablishes the original equilibrium configuration. The same is true for the bit positions when they are defined by an equilibrium domain configuration. It is a further attribute of wall topology storage that the magnetization at a data bit is orthogonal to the surrounding magnetization. Externally applied fields in the direction of the surrounding magnetization can thus be utilized to translate an existing magnetization configuration for accessing stored data. The consequences of equilibrium storage are threefold:

1. In contrast to conventional storage, the storage density is not limited by the finite coercivity of the storage medium. Densities up to approximately $10^{11}$ bits/cm$^2$ are in principle possible in equilibrium storage.

2. Since non-volatility does not depend on material coercivity in equilibrium storage, a storage medium having a very small coercivity can be employed. This makes it possible to propagate the data through a stationary storage medium and thereby eliminate mechanical accessing of the information.

3. The orientation of M in walls and domains is orthogonal to each other. This makes it possible to devise drive mechanisms for data propagation which intereact with the domain magnetization only, but do not affect the chiral states of the data bits.

The concept of equilibrium storage can be employed in many different ways, since there exist various possibilities for chiral data representation. Different schemes can also be devised and different techniques used to access and read/write the data. Consequently, the resulting system configurations within the scope of this invention are numerous. The following are but a few examples of storage, accessing and read/write methods available.

The design of such system configuration depends also on the orientation of M in the domains, domain walls and wall lines relative to the plane of the storage film and direction of the domain walls. These orientations are determined by material characteristics and thickness of the storage medium. Three different orientations for the domain and the wall magnetization exist. They in turn determine the orientation of M in the wall lines which must be orthogonal to both, the domain and the wall magnetization.

a. The storage medium has an easy axis of magnetization normal to the film plane. The magnetization in the domains is also oriented perpendicular to the film plane. The associated surface charges will cause a comparatively small equilibrium domain width. The walls are of the Bloch type, i.e. M in the center of the wall lies in the film plane and parallel to the wall. The orientation of the walls in the film plane is determined by the mechanism of domain generation.

b. The storage medium is comparatively thick and has an easy axis of magnetization in the film plane. The magnetization in the domains lies along the easy axis and surface charges arise only at the edge of the film. The equilibrium domain width is therefore comparatively large and depends on the film dimension parallel to the easy axis. The wall orientation is parallel to the easy axis.

c. The storage medium has an easy axis of magnetization in the film plane but is then compared to (b) above. This situation differs from (b) as the walls are of the Neel type with M in the center of the wall perpendicular to the wall direction.

1. Data Representation

In wall topology storage the data is to be stored by means of a corresponding sequence of polarity reversals along each domain wall. Such polarity reversals can represent data in two ways, namely:
 a. Through the presence or absence of a polarity reversal at each bit position.
 b. Through the chirality of the polarity reversal, i.e. the polarity of the wall lines.

Different encoding schemes are enumerated in the discussion of specific embodiments.

Both means of data representation require some mechansim for pinning wall lines to particular wall positions in order to define the bit positions. Intrinsic material coercivity model suffice for this purpose. However, if positional stability hinges on material coercivity, then the stored information must remain stationary and can only be accessed through mechanical motion. Since a system configuration not involving mechanical motion is advantageous, an additional mechanism must be incorporated for pinning the wall lines to the bit position along the wall without affecting wall motion. Such an effect can be achieved with a set of discrete tracks running perpendicular to the walls, described later in conjunction with the preferred embodiments. If the wall line energy is reduced on a track position, then the lines will stay on the tracks as the wall containing the lines moves through the storage medium. Because of the orthogonal orientation of walls and tracks, the tracks will not affect wall motion. A set of parallel grooves in the film surface, or an overlay of lines made of a soft magnetic material constitute such tracks for the wall lines. In the preferred embodiment shown in FIG. 7, these tracks are defined through magnetostatic interactions by the set of parallel domain walls in the drive film.

2. Accessing of Data

To access data in a stationary medium, the information must be moved through the storage medium. This is done by propagating the walls parallel to the bit tracks. In principle, there is no need to drive each wall individually, since the storage medium itself tries to maintain the equilibrium spacing between the walls. Instead, walls may be shifted at a few locations along the propagation direction only, with spacings between drive locations much larger than the distance between walls. Magnetostatic interactions between domains will tend to propagate the whole wall array in unison. In practice, the allowable separation between drive locations is limited, because every real material exhibits some finite coercivity for wall motion. When there are n walls between drive locations, then the drive mechanism has to overcome a coercivity n times the coercivity of an individual wall. However, this limitation is overcome with one of the following methods:

a. Anhysteretic wall motion. A spatially uniform ac field along the easy axis of magnetization will vacillate each wall about its equilibrium position, with the frequency of the applied field. If the field amplitude exceeds the coercive field of an individual wall, then the unidirectional wall propagation is anhysteretic.

b. Bias Pressure on Wall Array. A unidirectional pressure can be applied to each wall and thereby compensate for coercivity. A static basis field along the easy axis of magnetization will exert such a pressure, if the field magnitude decreases along the desired direction of wall propagation. The pressure arises because the average magnetostatic energy in the film increases with the magnitude of the bias field and the walls try to move toward a low energy position.

c. Wall Injection. When the storage medium is rectangular, current carrying conductors can be employed along opposite edges of the storage medium to inject new walls along one edge while at the same time ejecting an existing wall at the opposite edge. As the material tries to maintain fixed spacings between walls, the whole wall array will shift by one wall spacing during this process. A given number of current pulses will access the addressed wall.

d. Propagation of Bias Field. This technique employs a bias field along the easy axis of magnetization, with the field amplitude varying periodically along the direction of desired wall propagation. The wavelength of the bias field can be much larger than the spacing between walls. The peak amplitude of for example the sinusoidally varying bias field is such as to saturate the sample in regions of peak amplitude. The average magnetic energy density in the storage medium then varies with the local magnitude of the bias field, and the domain walls will occur in packages about regions of low field magnitude. When the applied field configuration is propagated in a direction perpendicular to the walls, then the wall packages will propagate along with the field. This method has the principle advantage that the drive fields can be produced with conductors for example, whose width is much larger than the wall spacing. A possible disadvantage of the method lies in the induced irregular spacing between walls.

e. Localized Drive Fields. Localized drive fields are to interact with the magnetization of two adjacent domains and the spatial extent of these fields along the direction of wall propagation must be comparable to the wall spacing. The drive fields do not however have to interact with the whole stripe domain but may be confined to the domain tip at the edge of the storage medium. Wall propagation is obtained by shifting the drive field configuration along the direction of wall propagation.

f. Passive Magnetic Circuits. In this approach, a soft magnetic material (keeper) is located in close proximity to the storage medium, as to provide partial shunting for the stray flux from the domain magnetization. The keeper has a structural asymmetry along the direction normal to the walls, and thereby creates a coercivity which is different for opposite directions of wall motion. A spatially uniform ac field is now applied to the storage medium along the easy axis of magnetization. In the absence of a keeper, such a field would just tend to vacillate each wall about its equilibrium position. With the keeper present the walls tend to move in the direction of low coercivity only and unidirectional propagation of the wall array is accomplished.

3. Drive Field Generation

Some of the above methods employ spatially non-uniform drive fields, which are to interact with the domain magnetization in the storage medium. Means are thus necessary to propagate these drive fields along some axis. The following methods are used to generate and propagate drive fields:

a. Current Carrying Conductors. The desired field configuration is generated with suitable current carrying conductors. The field position is then shifted by activating a conductor located a certain distance from the first one. Three such conductors, activated in a three phase sequence, are in general required to obtain unidirectional field propagation.

b. Discrete Active Magnetic Circuits. The desired field configuration can be generated with a magnetic circuit which then is driven by a spatially uniform drive field. When these circuits are in close proximity to the storage medium, their stray fields will interact with the domain magnetization in the storage medium. The desired configuration of the stray fields is obtained by using an appropriate circuit geometry. For propagating the stray fields, the circuit geometry must be periodic along the propagation direction. Propagation occurs when the circuits are activated by a uniform, but rotating drive field. The direction of propagation depends on the handedness of rotation. Instead of a rotating, an alternating drive field can be employed, if the circuit has a suitable asymmetry about the propagation axis.

c. Homogeneous Active Magnetic Circuits. Instead of generating the desired field configuration by using a suitable circuit geometry, the domain geometry in a proximate continuous medium can be utilized to generate the drive fields. These fields are the stray fields associated with the equilibrium domain configuration in said drive medium. To propagate the stray fields, the domain configuration is propagated in the drive medium. Thus the drive mechanism only has translated from the storage medium to a separate drive medium, but in doing so, advantages are gained. The material characteristics and geometry of the drive medium can be tailored for its drive function, while the storage medium is optimized for its storage function. Also, large separation between the drive conductors and the read element yields improved decoupling between these two components. And, one drive medium can interact with several storage planes.

4. Writing of Data

In one storage scheme, the write process determines the chiral state of the addressed wall segment. Depending on the system configuration, two different write mechanisms may occur.

a. Bias Writing. In a system operating as a set of parallel shift registers, where the walls propagate from one to the opposite edge of the storage medium, data can be written as the walls are injected at the edge of the storage film. In this case, the write field has to perform merely a bias function to perturb the degeneracy between the two storage states.

b. Transitional Writing. In a circulation system, where the walls propagate around a closed loop, it is necessary to reverse the state of some wall segments to overwrite existing data. In this case, the write field must overcome the energy barrier associated with a transition between the two storage states.

Transitional and bias writing hence require write fields of different magnitude. Otherwise the write process is identical: a magnetic field is applied about an area containing the data bit. The direction of said applied field is parallel to the wanted domain wall polarity or wall line polarity depending on the scheme of data representation. If the applied field is of sufficient magnitude, it will reverse the polarity of the storage state.

5. Reading of Data

In wall topology storage the data can be read by sensing the magnetic stray fields from data bits by means of a flux sensing device. Inductive read elements and magnetoresistive transducers are examples of such sensing devices. It is also possible to sense the state of data bits magneto-optically by sensing the change in polarization of a light beam passing through a data bit.

II. Specific Embodiments

The magnetization (M) in a demagnetized anisotropic medium is divided into domains with different orientations of M. If the medium is magnetically continuous, then M does not change it orientation abruptly at domain boundaries, but over a transistion region, the domain wall, of finite width. Across the width of the wall, M rotates in a well defined fashion, dictated by intrinsic magnetic properties and physical dimensions of the sample. When M in the adjacent domains is antiparallel the sense of rotation, however, is indeterminate.

Figure 1A:
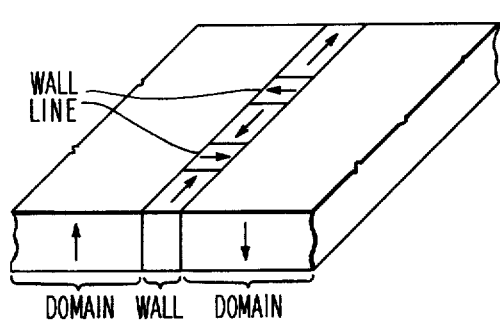
FIG. 1 depicts domain walls in magnetic films with (a) the easy axis normal to the film plane and (b) the easy axis in the film plane.
Figure 1B:
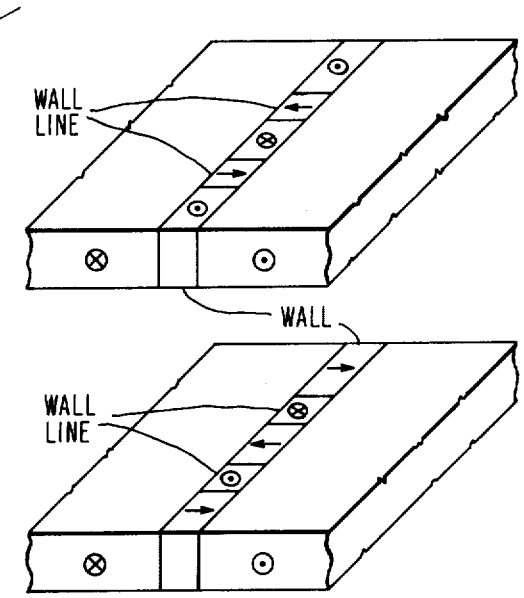

Two opposite wall polarities are hence equally likely to exist. Under appropriate conditions, both polarities are often found to occur alternately along the wall. Like the domain wall, the wall line between wall segments of opposite polarity has a well defined length but an indeterminate sense of rotation. A random distribution of wall line polarities is often observed along the wall. FIG. 1 depicts types of domain walls are associated wall lines for magnetic films with (a) the easy axis normal to the film plane and (b) the easy axis of magnetization of the film plane.

Particular trains of wall polarities can be written so that the resulting wall topology represents binary data. A binary number may be represented by:

1. The polarity of a unichiral wall (entire wall).
2. The presence or absence of a wall line at a particular (bit) location.
3. The polarity of a wall line at a bit location
4. A combination of (2) and (3).

Figure 2:
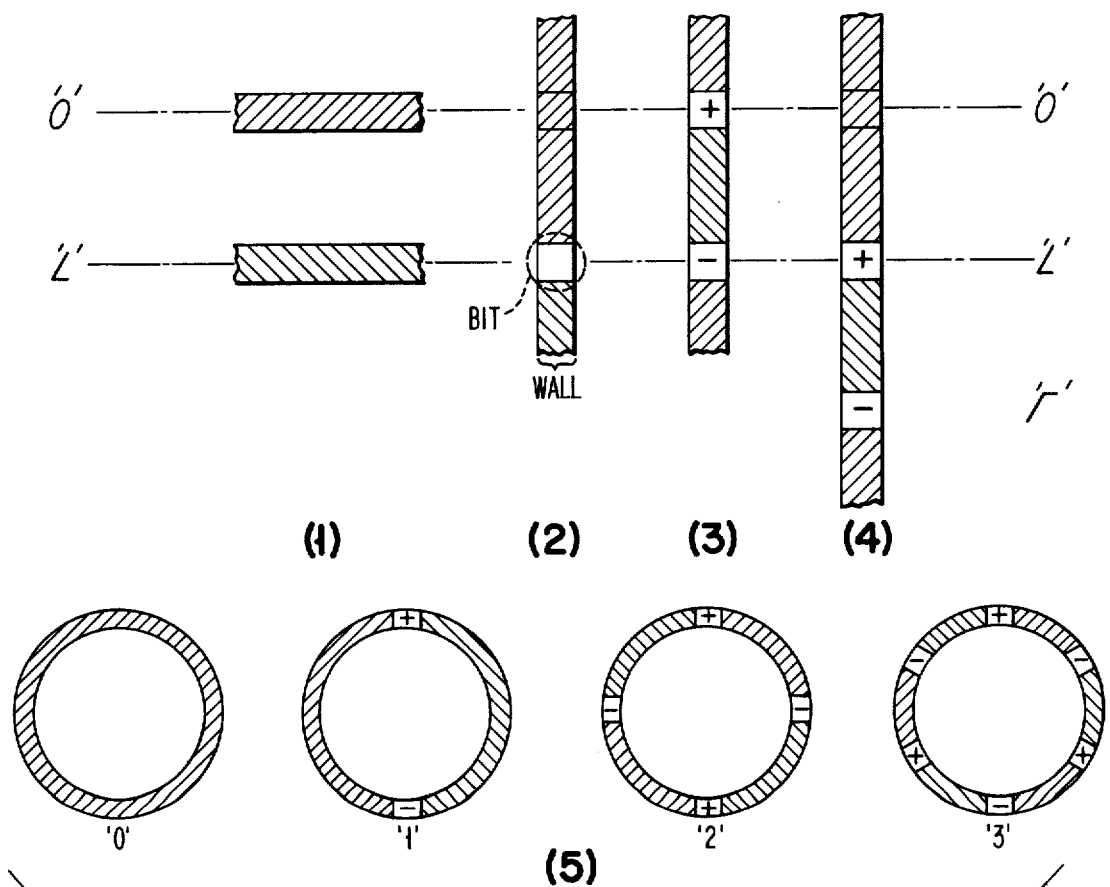
FIG. 2 depicts different schemes for data representation.

FIG. 2 shows examples of these encoding schemes.

The storage concept described in prior art is shown in FIG. 2-1 for reference purpose. The figure depicts two domain walls of uniform, but each of opposite polarity as indicated by the direction of hatching. The two polarities are used to represent two values of binary data.

FIG. 2-2 illustrates a first method for storing a plurality of binary data bits along each domain wall. In this method, 'O' 's are represented by the absence of a wall line at specified bit positions, whereas 'L' 's are represented by the presence of a wall line at such bit positions. The bit positions, located at regular spacings along each domain wall, are defined by the set of discrete tracks running perpendicular to the wall (described on page 8). In this storage scheme, the polarity of wall lines need not be controlled.

Figure 3:
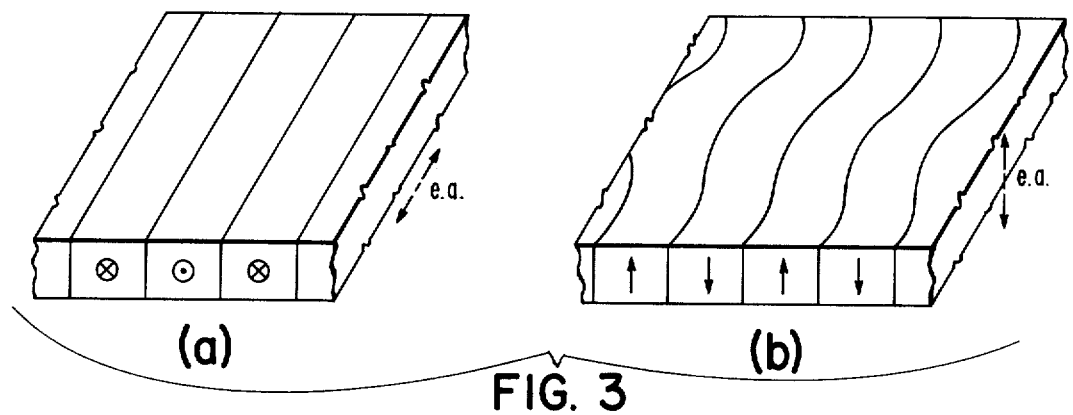
FIG. 3 shows stripe domains in a film having (a) the easy axis in the film plane and (b) the easy axis normal to the film plane.
Figure 4:
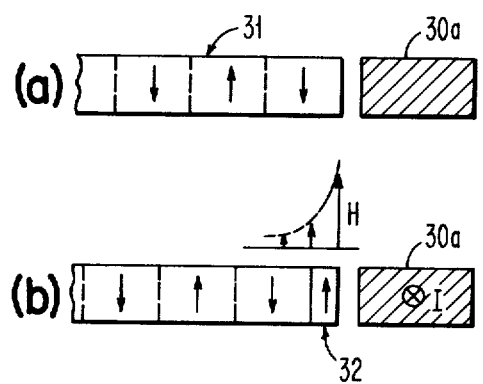
FIG. 4 and 5 show methods of wall injection and wall ejection, respectively.

FIG. 2-4 illustrates a method for storing a plurality of ternary data bits along each domain wall. This scheme differs from the one shown in FIG. 2-2, in that not only the presence or absence, but also the polarity of wall lines is being controlled. The ternary values at bit positions are then represented by:

'O' — the absence of a wall line
'L' — presence of a wall line with positive polarity
'Γ' — presence of a wall line with negative polarity As in FIG. 2-2, bit positions are again defined by a set of discrete tracks running perpendicular to the walls.

FIG. 2-5 illustrates a method for storing data bits in a number system whose base may be arbitrarily high—for example, decimal. In this scheme, the value of each data bit is determined by the number of wall lines along specified wall segments where all wall lines within a data bit have identical chirality so that they cannot unwind. Each wall segment constituting one data bit may again be defined by lines attached to discrete tracks normal to the walls. However, a preferred embodiment for this method of data representation utilizes closed domain walls like the ones of cylinder domains. Each cylinder domain then stores one data bit, the value of said data bit being determined by the number of wall line pairs contained in the domain wall.

FIG. 2-3 illustrates a second method for storing a plurality of binary data bits along each domain wall. This scheme utilizes one wall line at each bit position. The binary values are represented by the polarity of said wall lines. Bit positions may again be defined by a set of discrete tracks normal to the domain walls. However, since in this scheme of data representation the wall segments between successive bit positions are alternately of positive and negative polarity, in a preferred embodiment the storage film is superposed above a drive film so that the domain array in the drive film defines the bit positions in the storage film (as described on page 18). In this embodiment stored data can be accessed orthogonally through a translation of the domain arrays in the drive and in the storage films.

In furtherance of any of these encoding schemes, it is desirable to generate stripe domain configurations and to have the ability to generate and propagate parallel domain walls.

Stripe domains form naturally in demagnetized magnetic films having an easy axis of magnetization in the film plane, FIG. 3a. The equilibrium spacing between walls is determined by intrinsic material properties and film dimensions as to minimize the sum of magnetostatic and wall energy. Because stray fields arise only at the film edges in this anisotropy configuration, the spacing between walls is comparatively large. Smaller spacings occur in films having an easy axis perpendicular to the film plane, but their domain configuration is undetermined as many different patterns will yield roughly the same energy. Serpentine patterns are typically obsrved in self-demagnetized samples as shown in FIG. 3b. Demagnetization in the presence of an in-plane bias field, however, yields a regular array of stripe domains parallel to this bias field.

Such regular arrays of stripe domains can also be generated by alternately switching the magnetization along one film edge into opposite directions. This is shown in FIG. 4a, b, c. Current carrying conductor 30 runs along one film edge. The initial condition of the film 31 is shown, with alternating polarity domains. The magnetic field about the conductor 30a in FIG. 4(b) switches the magnetization along the film edge into the field direction by nucleating a domain wall 32 which then moves a certain distance from the film edge. A new equilibrium state FIG. 4c is then attained. When the current direction is reversed, a new domain wall is produced so that an alternating current injects two domain walls during each cycle. The generated walls shift away from the film edge to retain the characteristic separation between walls. As the wall arrives at the opposite film edge, it ceases to exist.

The foregoing description a priori assumed wall injection when the polarity of the applied field is anti-parallel to the magnetization along the film edge. Such a field may however cause ejection of the wall next to the film edge instead as described with FIG. 5a–c, for a certain energy barrier must be overcome for nucleating a new wall. Which process occurs is determined by the spatial configuration of the applied field and by the shape of the current pulse. A short duration field that falls off rapidly with distance from the film edge will cause wall injection, as the nearest domain wall is subject to a much smaller field and does not have time to move back to the film edge. Conversely, a field of longer duration but with a smaller gradient causes wall ejection, particularly when the field magnitude is insufficient to overcome the nucleation barrier.

Figure 6:
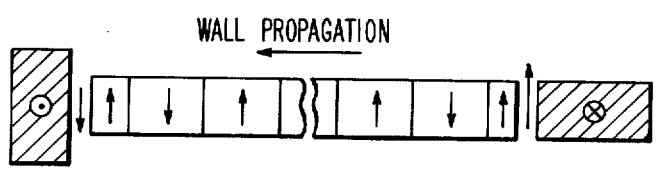
FIG. 6 shows the combination of wall injection and ejection in a magnetic film.

Both processes may be utilized in a system whereby a wall is injected along one film edge and at the same time a wall is ejected at the opposite film edge as shown in FIG. 6. Such a system assures that the number of walls in the film remains constant.

Figure 5:
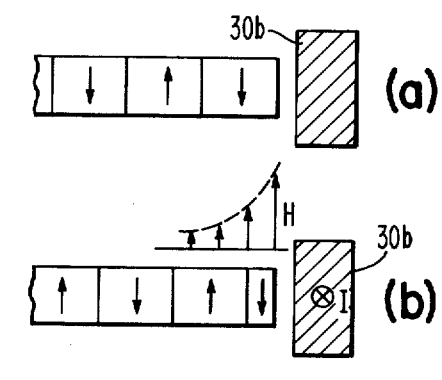

Utilizing the concept and coding scheme of FIGS. 1 and 2 in conjunction with the propagation method of FIGS. 4–6, a wall topology memory may be built. Thus the system below produces a regular array of bits in the storage plane and provides for moving the bit array about the plane.

Figure 7:
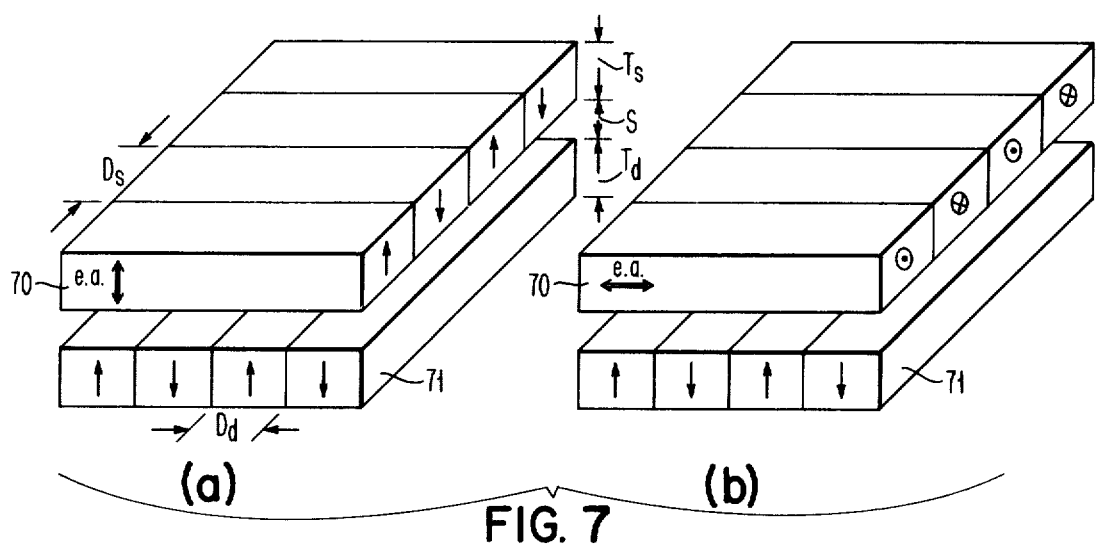
FIG. 7 shows two wall topology devices utilizing storage and drive films.

FIG. 7 shows two wall topology memories which employ the method disclosed here. Both systems consist of two superimposed magnetic films. One, the storage film 70 is used for information storage; the other, the drive film 71, controls the bit positions in the storage film. Systems 7($a$) and 7($b$) differ only in the anisotropy characteristics of the storage film. In system 7($a$) the easy axis of magnetization is normal to the film plane whereas in system 7($b$) the easy axis lies in the film plane. Although the two anisotropy characteristics yield different orientations of the magnetization in the storage film, the domain configurations are the same in both cases, an array of stripe domains. In both systems, binary data is to be stored in the wall lines of the storage film, whereby each wall contains a train of data bit. These bits are located wherever the wall reverses its polarity. The magnetization's sense of rotation at the bit location determines the stored binary value.

FIGS. 7–9 show the method for positioning bits at controllable locations along the walls. The required polarity reversals are induced by stray fields which originate from the domains in the underlying drive film. This film has an easy axis of magnetization normal to the film plane and like the storage film contains an array of stripe domains, but oriented orthogonally to the ones in the storage film. Magnetostatic interactions between drive and storage film generate a regular array of bits in the latter, one bit for each wall intersection.

Consider the situation when storage and drive film are widely separated as to be noninteracting, FIG. 7. The magnetization within the domains of the storage film 70 then lies along the easy axis as indicated. The local wall polarity is undetermined, for 180° walls of equal energy are associated with either polarity. Reversals in wall polarity are hence incidental and usually occur at random intervals.

The situation changes as the separation between storage and drive film is reduced so that the stray fields from the drive film domains can interact with the magnetization in the storage film, as shown in FIG. 8, where FIG. 8$a$ and 8$b$ correspond to FIG. 7$a$ and 7$b$ respectively. These stray fields now tilt the magnetization in the storage film 70 domains through a small angle $\theta$ from the easy axis. The angle $\theta$ is determined by the stray field component perpendicular to the magnetization.

Thus $\theta = H_x/H_u$ in system 8 ($a$); $\theta = H_z/H_u$ in system ($b$), where $H_u$ is the effective anisotropy field in the storage film, $H_x$ and $H_z$ are the horizontal and vertical components of the stray fields respectively. These stray field components have the same periodicity as the domains in the drive films and are given by: $H_x = -H_o \cos kx$; and $H_z = H_o \sin kx$, where $k = \pi/D_d$ and $H_o = 8 M_d e^{-kz}(1-e^{-k T}d)$. $M_d$ is the saturation magnetization in the drive film, $D_d$ is the domain width in the drive film and $T_d$ is the thickness of the drive film. FIG. 8 shows the coordinate system used and also depicts the alternating tilt of the magnetization in two adjacent domains of the storage film. Now the local wall polarity is no longer undetermined, since a (180−2$\theta$)° wall is associated with one polarity whereas a (180+2$\theta$)° wall would be associated with the opposite polarity. The energy, $\sigma$, of the (180−2$\theta$)° wall is lower by an amount $\Delta \sigma/\sigma = \pi \theta$ and this wall type will hence occur. But as $\theta$ alternates with the periodicity of the drive film domains, the polarity of the storage film walls will alternate with the same periodicity, bit positions occur at every polarity reversal and the desired bit array has been generated.

FIG. 9 depicts the utilization of the shift method with storage system 8($a$). Domain shifting in the drive film 71 with the current $I_d$ from conductor 74 will shift the bit array 80 in the x-direction. If instead the domains in the storage film are shifted with current $I_s$ from conductor 75, then the bit array 80 will be shifted in the y-direction. A combination of both processes allows for othogonal accessing of the stored information.

For simplicity, the disclosed embodiment has been described for storage films having an uniaxial anisotropy. For some purposes, it may be advantageous to employ storage films having a biaxial anisotropy in the plane parallel to the domains, in order to facilitate the alternating tilt of the magnetization.

The advantages of such a system are manyfold. Since domain walls and wall lines have well defined micromagnetic configurations, wall topology storage is not subject to creeping disturb by demagnetization. A single domain wall may contain a large number of bits (the length of a wall line is comparable to the width of a domain wall). Wall topology storage hence offers higher packing densities than domain storage. By pinning wall lines to particular positions along the wall, then walls can be moved through the storage medium without altering the wall topology. A wall (constituting a track of bits) may then be addressed by moving it to a read/write location. The spacing between walls can be expanded about this location by magnetic overlays to facilitate read/write operations, but compressed in other areas of the medium for high density storage.

Different materials may be utilized for the magnetic materials. These include NiFe films, MnBi, Co, magnetic ferrites and other well known magnetic materials, preferable in film form, as disclosed in the art. In a preferred embodiment to illustrate the invention, a single crystal rare earth iron garnet film, preferably europium/gallium iron garnet, is used for both storage and drive film. The films are substantially 5 microns thick, and the storage film is upon a single crystal gadolinium-gallium garnet substrate. The planar film may be 1 inch square. The magnetic domains are, in one example, 6 microns by 1 inch long, the walls being 0.06 microns in width. The wall line width is 0.2 microns. The unichiral segments between lines are about 6 microns in length.

The particular material affects domain and wall size. When cobalt is used, domains of less than 1 micron may be obtained. Further, thinner films are known to afford smaller domains, according to the known relationship between width of domains and the thickness of the film layer for each different magnetic material.

Further, while the effects noted above are for magnetic films, the same is conceptually true for some ferroelectric materials having ferroelectric domains and walls separating one ferroelectric domain from another.

Basically then the above device is a data storage medium comprising at least one magnetic domain wall separating adjacent magnetic domains, at least one wall polarity reversal i.e. a wall line presenting a data bit. The value of said data bit is given by the presence or absence and/or by the polarity of the wall line. These reversals can store binary data, ternary data or data to any base greater than two. It is preferred that the domains be substantially orthogonal configuration although one embodiment utilizes a cylinder domain configuration. Where cylinder configuration exists, obviously a closed domain wall exists, and there can only be an even number of polarity reversals. As the data storage apparatus, accessing read/write means are utilized for determining the polarity state of the data bits. Further, generating means for generating domains in the storage medium may also be utilized. This includes means for injecting and ejecting domains, such as a conductor medium described previously. Synchronizing means may also be utilized in conjunction with the conductor means as shown in FIG. 9, to maintain the rate of generation and removal of domains to maintain the number of domains in a desired amount. The stripe domain configuration as noted above is the preferred embodiment. Further within the preferred embodiment an orthogonal drive film and storage film system as described in conjunction with FIGS. 7, 8, 9 is desired. As a method, broadly the data can be stored at polarity reversals in a magnetic domain wall separating two adjacent domains comprising the steps of generating at least one domain wall and the magnetic domain material by generating at least two adjacent domains in the material, and generating at least one desired polarity reversal within the domain wall representing data stored in the wall. Further, the polarity reversals may be achieved in a number of ways as discussed above, as by interacting the magnetic field of the write means with the localized region of the wall chosen to store the data. Reading and writing of data may include a magnetic inductive recording head which is to interact with the magnetization comprising a data bit. Data stored in the walls may be sensed by locating a magnetic polarity sensing means to sense the domain wall regions capable of having polarity reversal representing data stored in the wall, and the sensing the polarity fo the wall reversal regions as indicative of the data stored in the walls.

Other embodiments will be evident to those skilled in the art, within the scope of this invention.

What is claimed is:

1. A data storage apparatus comprising a magnetic storage medium having a series of stripe domains separated by domain walls having at least one polarity reversal in the wall, the sign of said polarity reversal representing data stored in the wall, and
   a drive film comprising a series of stripe domains separated by domain walls and located adjacent to and orthogonal to the stripe domains in said storage medium, wherein the intersections of the domain walls of said storage medium and of said drive film define bit locations.

2. The apparatus of claims 1 including generating means for generating domains in and removal means for removing domains from the drive film.

3. The apparatus of claim 1 including means for changing state of the polarity reversal.

4. The data storage apparatus of claim 1 including generating means for generating domains in the storage medium.

5. The data storage apparatus of claim 4 wherein the generating means comprises at least one electrical conductor located adjacent the medium to generate domains as a function of the applied current direction.

6. The data storage apparatus of claim 4 including removal means for removing domains in the storage medium.

7. The data storage apparatus of claim 6 wherein the removal means comprises at least one electrical conductor located adjacent the medium to remove domains as a function of the applied current direction.

8. A method of reading data stored as the sign of the polarity reversals in domain wall in a magnetic storage medium having a series of stripe domains separated by domain walls and having a drive film comprising a series of stripe domains separated by domain walls and located adjacent to and orthogonal to said stripe domains in said storage medium and where the intersections of the domain walls of said storage medium and of said drive film define bit locations comprising the steps of
   sensing the sign of the polarity of the wall reversal at a first bit location as indicative of data stored in the walls.

9. A method as described in claim 8 including the step of
   moving the sensing means relative to said first bit location to access a second bit location.

10. A method as described in claim 8 including the step of
    moving the domains in said drive film relative to said drive film to access a third bit location.

11. A method as described in claim 8 including the step of
    moving the domains in said storage medium relative to said storage medium to access a fourth bit location.

12. A method as described in claim 11 including the step of
    moving the domains in said drive film relative to said drive film to access a fifth bit location.

13. A method as described in claim 12 including the step of
    moving the sensing means relative to said drive film to access a sixth bit location.

* * * * *